(12) United States Patent
Chun et al.

(10) Patent No.: US 12,546,000 B2
(45) Date of Patent: Feb. 10, 2026

(54) SUBSTRATE PROCESSING METHOD

(71) Applicant: ASM IP Holding B.V., Almere (NL)

(72) Inventors: Seungju Chun, Hwaseong-si (KR); SeongMin Han, Yongin-si (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/913,070

(22) Filed: Oct. 11, 2024

(65) Prior Publication Data
US 2025/0122617 A1     Apr. 17, 2025

Related U.S. Application Data

(60) Provisional application No. 63/544,271, filed on Oct. 16, 2023.

(51) Int. Cl.
*C23C 16/455* (2006.01)
*C23C 16/30* (2006.01)
*C23C 16/515* (2006.01)

(52) U.S. Cl.
CPC ........ *C23C 16/45536* (2013.01); *C23C 16/30* (2013.01); *C23C 16/45553* (2013.01); *C23C 16/515* (2013.01)

(58) Field of Classification Search
None
See application file for complete search history.

(56) References Cited

U.S. PATENT DOCUMENTS

| 7,251,121 B2* | 7/2007 | Bhutta | H01G 5/40 |
| | | | 361/278 |
| 2023/0260754 A1* | 8/2023 | Kim | H01J 37/32449 |
| | | | 156/345.28 |

* cited by examiner

*Primary Examiner* — Michael P. Rodriguez
(74) *Attorney, Agent, or Firm* — Snell & Wilmer L.L.P.

(57) ABSTRACT

Provided is a method of forming a conformal film on a recess of a substrate in a reaction chamber by repeating a cycle comprising forming a first film comprising supplying a silicon source and a reactant and applying a first power from a power supply unit to the reaction chamber while supplying the silicon source and the reactant, treating the first film by applying a second power from the power supply unit to the reaction chamber while supplying the reactant, wherein the first power is applied in a pulsed mode, wherein the power supply unit comprises a matching network comprising electronically variable capacitors.

28 Claims, 12 Drawing Sheets

PRIOR ART

PRIOR ART

PRIOR ART

SUBSTRATE PROCESSING METHOD

CROSS-REFERENCE TO RELATED APPLICATIONS

This application claims priority to U.S. Provisional Patent Application Ser. No. 63/544,271 filed Oct. 16, 2023 titled SUBSTRATE PROCESSING METHOD, the disclosure of which is hereby incorporated by reference in its entirety.

FIELD OF INVENTION

The disclosure relates to a method of forming a film on a recess, more particularly to a method of forming a film on a recess quickly and conformally.

BACKGROUND OF THE DISCLOSURE

As the line width of the integrated circuit such as semiconductor device continues to shrink, a film formed on the device structure becomes thinner and a thermal budget on it deteriorates a device performance. Therefore, a demand for low temperature process as well as more precise control of the conformality of a film increases. To that end, a plasma enhanced atomic layer deposition (PEALD) method was introduced to form a conformal film on a device structure such as a recess at low temperature.

The PEALD method introduces a plasma to an atomic layer deposition (ALD) process to activate at least one of a source gas, a reactant and a purge gas, and therefore enables a film to be formed conformally along the surface of the device structure at low temperature.

In PEALD method, a source gas and a reactant are supplied sequentially and intermittently unlike a plasma enhanced chemical vapor deposition (PECVD) method in which a source gas and a reactant are supplied simultaneously. Thus, the PEALD method has a longer process time compared to the existing PECVD method.

In order to apply a power and generate a plasma in the PEALD method, a matching network is used to match an impedance between a power generator and a reaction chamber in order to prevent a reflect power and generate a stable plasma in a reaction chamber.

FIG. 1 illustrates a brief view of substrate processing apparatus.

In FIG. 1, the substrate processing apparatus 1 may comprise a reaction chamber 2, a gas supply unit 3, a substrate support unit 4 supporting a substrate 5, and an exhaust unit 6. The gas supply unit 3 may be a showerhead plate and the substrate support unit 4 may comprise a heating block (not shown) to heat up the substrate 5.

The substrate processing apparatus 1 may further comprise a power supply unit 7. The power supply unit 7 may comprise a power generator 8 and a matching network 9. The power supply unit 7 may be connected to at least one of the gas supply unit 3 and the substrate support unit 4 to apply a power thereto. Therefore, the gas supply unit 3 and the substrate support unit 4 may act as electrodes (an upper electrode and a lower electrode respectively).

FIG. 2 illustrates a configuration of conventional mechanical matching network. In FIG. 2, the matching network 9 may comprise a first Variable Vacuum Capacitor (VVC) 10, a second Variable Vacuum Capacitor (VVC) 11, a first driving motor 12 to drive the first VVC 10, a second driving motor 13 to drive the second VVC 11, an inductor 14, and a control unit 15 with a software or a firmware installed therein.

The matching is carried out by a mechanical movement of the first VVC 10 and the second VVC 11 driven by the driving motors 12 and 13, respectively. The VVCs takes time to move to positions for matching the impedance, therefore it is limited in further reducing a matching time and a process time.

FIG. 3 illustrates a change of forward power and reflected power when matching the impedance by moving the Variable Vacuum Capacitors (VVCs) of the conventional mechanical matching network.

In FIG. 3, when a power (i.e. a forward power) is applied, a reflected power is also generated during a period P1 simultaneously. The reflected power is a power that does not contribute to a process and, as a result, a quality of the process may be deteriorated. During the period P1, an impedance matching is carried out between a power supply unit and a reaction chamber by a matching network. That is, the first VVC 10 and the second VVC 11 as shown in FIG. 2 move to find an impedance matching position in which a reflected power is eliminated. In other words, the period P1 may be referred to as an impedance matching time.

After the impedance matching is completed, no reflect power exists and a plasma becomes stable during a period P2. During the period P2, a full forward power contributes to activating a gas. Therefore, a quality of the process and the efficiency thereof may further improve.

As shown in FIG. 3, reducing the period P1 (i.e. the impedance matching time) may result in a fast substrate processing as well as an efficient substrate processing. However, as aforementioned, since the mechanical and physical movement of VVCs in the mechanical matching network requires some time (e.g., longer than 0.3 seconds), there is a limitation in reducing the impedance matching time and achieving a short process time. In addition, the mechanical matching network comprises mechanical parts, which are susceptible to failures frequently during an impedance matching.

Thus, a new approach is required to reduce an impedance matching time, achieve a short process time and operate the matching network stably in the fast process.

SUMMARY OF THE DISCLOSURE

The disclosure discloses relates to a method of forming a film on a recess, more particularly to a method of forming a film fast and conformally along the surface of a recess of a substrate.

In one or more embodiments, a method of forming a film may comprise loading a substrate comprising a recess into a reaction chamber comprising a gas supply unit, forming a first film on the substrate by supplying a silicon source from a source vessel and a reactant to the substrate through the gas supply unit while applying a first power from a power supply unit to the reaction chamber, and treating the first film by applying a second power greater than the first power from the power supply unit to the reaction chamber while supplying the reactant.

In one or more embodiments, forming the first film and treating the first film may be repeated a plurality of times.

In one or more embodiments, the power supply unit may comprise a matching network comprising electronically variable capacitors to match an impedance between the power supply unit and the reaction chamber.

In one or more embodiments, a matching time between the power supply unit and the reaction chamber may be 5 milliseconds or less, while supplying the first power and supplying the second power.

In one or more embodiments, the method may further comprise purging the reaction chamber after forming the first film and before treating the first film.

In one or more embodiments, the silicon source may be supplied for 0.1 seconds or less.

In one or more embodiments, the first power may be between 10 W and about 2,000 W, more specifically, between about 20 W and about 500 W.

In one or more embodiments, the first power may be applied in a pulsed mode.

In one or more embodiments, a duty ratio of the first power may be between about 5% and about 50%, more specifically, between about 10% and about 30%.

In one or more embodiments, a pulsing frequency of the first power may be between about 100 Hz and about 3,000 Hz, more specifically, between about 300 Hz and about 1,000 Hz.

In one or more embodiments, the first power may be applied for 0.1 seconds or less.

In one or more embodiments, the second power may be applied in a continuous mode in dual frequencies and may comprise a high frequency power and a low frequency power.

In one or more embodiments, the high frequency power of the second power may be between about 500 W and about 3,000 W, more specifically, between about 1,000 W and about 2,000 W and the low frequency power of the second power may be between about 50 W and about 1,000 W, more specifically, between about 100 W and about 800 W.

In one or more embodiments, the second power may be applied for 0.2 seconds or less.

In one or more embodiments, the source vessel may be maintained at 50° C. or less.

In one or more embodiments, a thickness of the gas supply unit may be 10 mm or less.

In one or more embodiments, the method may further comprise forming a second film on the first film by repeating a cycle comprising: supplying the silicon source to the reaction chamber; applying the first power to the reaction chamber to form the second film, wherein the reactant may be supplied throughout the cycle, wherein forming the first film and forming the second film may comprise a super cycle, wherein the super cycle may be repeated a plurality of times.

In one or more embodiments, the first film may be thicker in an upper portion of the recess and the second film may be thicker in a lower portion of the recess, wherein the film comprising the first film and the second film may be conformal from the upper portion to the lower portion of the recess.

In one or more embodiments, the first film and the second film may comprise at least one of silicon oxide, silicon carbon oxide, silicon nitride, silicon carbon nitride, silicon carbon oxynitride and the combination thereof.

In one or more embodiments, the silicon source may comprise at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Mc)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; or a mixture thereof.

In one or more embodiments, the reactant may comprise at least one of $O_2$, $O_3$, $CO_2$, $H_2O$, $NO_2$, $N_2O$, $N_2$, $NH_3$, $NH_4$, $N_2H_2$, $N_2H_4$, radicals thereof; or a mixture thereof.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particularly disclosed embodiments described below As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

Figure 4:
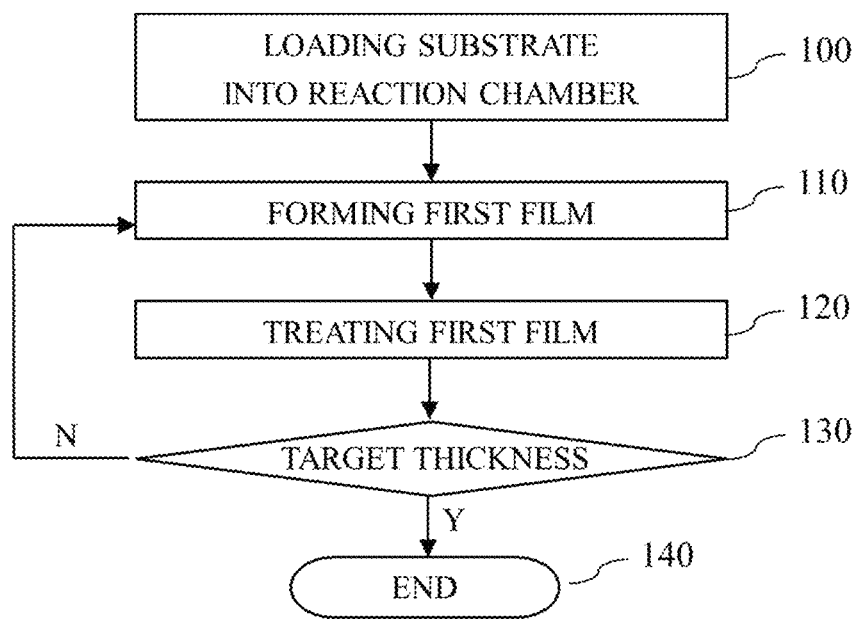
FIG. 4 illustrates a substrate processing method according to the embodiment of the present disclosure.

FIG. 4 illustrates a substrate processing method according to the embodiment of the present disclosure.

Figure 1:
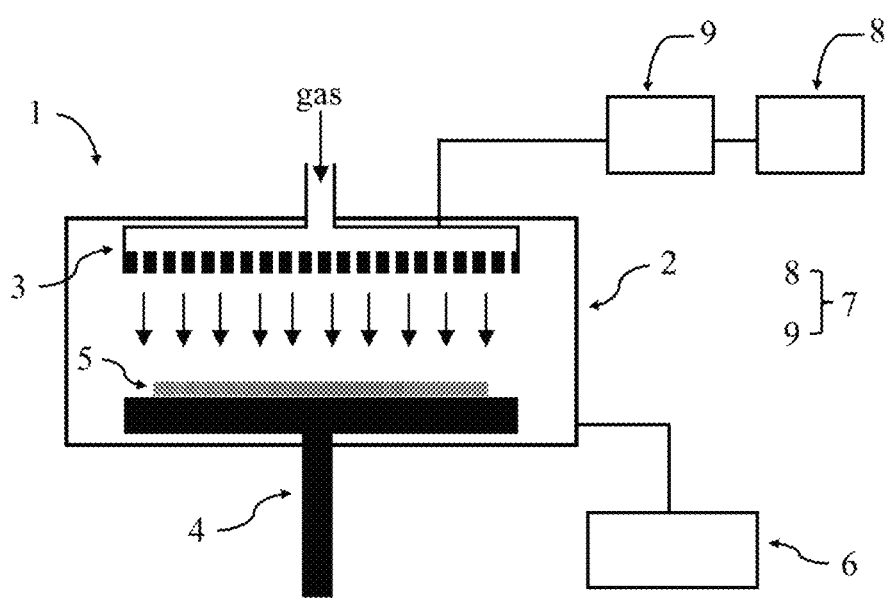
FIG. 1 illustrates a brief view of substrate processing apparatus.
Figure 2:
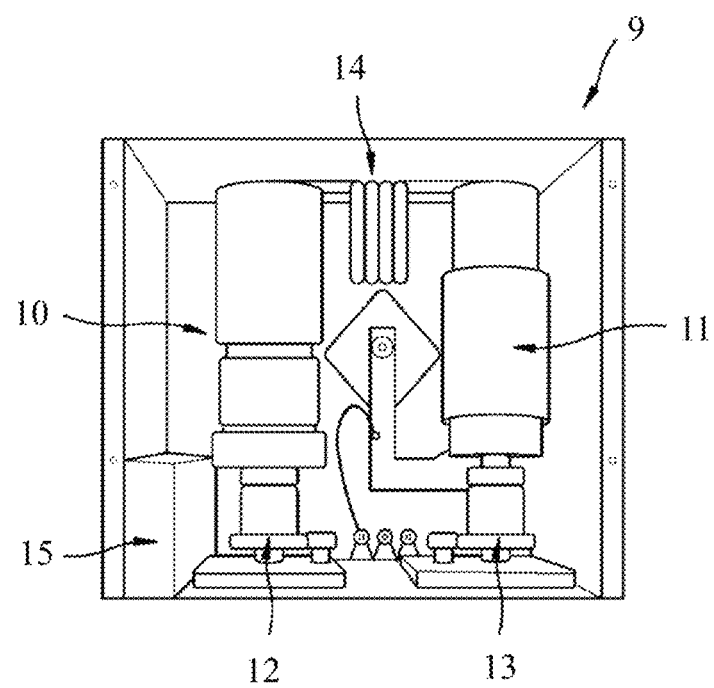
FIG. 2 illustrates a configuration of conventional matching network.
Figure 3:
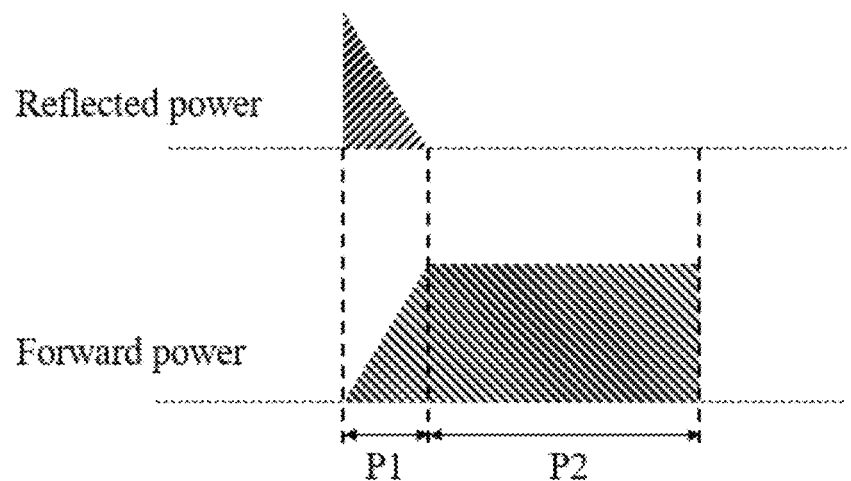
FIG. 3 illustrates a change of forward power and reflected power when using the existing matching network which uses variable vacuum capacitors (VVCs).

In step 100, a substrate is loaded into a reaction chamber. As shown in FIG. 1, the reaction chamber may be provided with a gas supply unit 3 connected to a power supply unit 7. The power supply unit may comprise a power generator 8 and a matching network 9. The substrate may comprise a complex structure, e.g. a recess and 3D gate structure etc.

In step 110, a first film may be formed on the substrate. The first film may be formed by supplying a silicon source from a source vessel and a reactant to the substrate through a gas supply unit while applying a first power from the power supply unit to the reaction chamber. The silicon source and the first power may be supplied simultaneously.

The silicon source may be supplied for 0.1 seconds or less and the first power which is applied simultaneously may be applied 0.1 seconds or less accordingly. The first power may be between about 10 W and about 2,000 W, more specifically, between about 20 W and between 500 W, and the frequency of the first power may be between about 1 MHz and about 30 MHZ, more specifically, between about 10 MHz and about 20 MHz.

The silicon source may comprise at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Mc)]_2$; AHEAD, $Si_2(NHEt)_6$; TEAS, $Si(NHEt)+$; $Si_3H_8$; DCS, $SiH_2Cl_2$; $SiHI_3$; $SiH_2I_2$; or a mixture thereof.

The reactant may comprise at least one of $O_2$, $O_3$, $CO_2$, $H_2O$, $NO_2$, $N_2O$, $N_2$, $NH_3$, $NH_4$, $N_2Hdury\ ratio_2$, $N_2H_4$, radicals thereof; or a mixture thereof.

The first film may comprise: silicon, carbon, nitrogen, or oxygen. The carbon and the nitrogen may come from a silicon source molecule. Thus, the first film may be at least one of silicon oxide, silicon carbon oxide, silicon nitride, silicon carbon nitride, silicon carbon oxynitride, or a combination thereof.

According to an embodiment of the present disclosure, during applying the first power, an impedance matching may be carried out between the power supply unit and the reaction chamber. The power supply unit may comprise a matching network and a power generator.

The matching network in the present disclosure may comprise an electronically variable discrete capacitor (EVC) array, a common bottom electrode, an individual top electrode connected to each EVC, and a switching mechanism comprising PIN diodes. When carrying out an impedance matching, various combinations among capacitors may be made swiftly. Thus, it enables to find the matching positions fast, compared to the existing variable vacuum capacitors (VVCs). U.S. Pat. No. 7,251,121 (incorporated by reference) describes a mechanism of the EVC matching network in detail. By using the EVC matching network, the impedance matching time may be significantly reduced and the reflected power may also be significantly eliminated.

Figure 5:
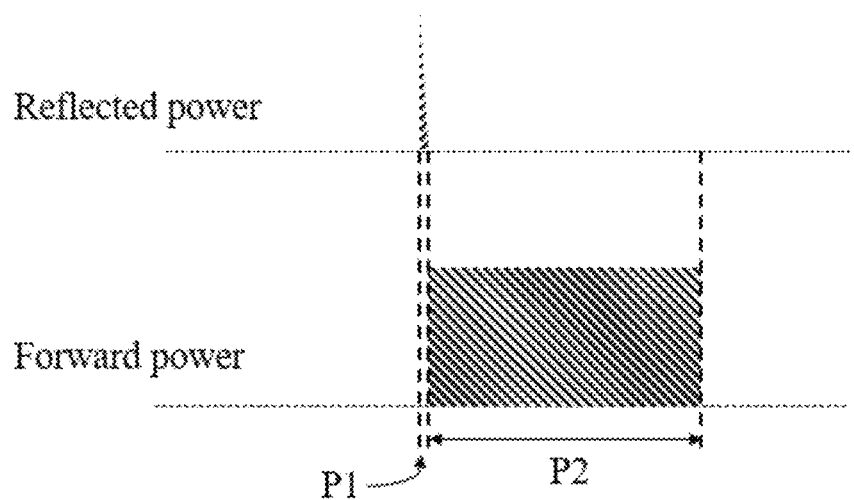
FIG. 5 illustrates a change of forward power and reflected power when using the EVC matching network.

FIG. 5 illustrates a change of forward power and reflected power when using the EVC matching network. In FIG. 5, the period P1 (i.e., the impedance matching time) is significantly reduced and a reflected power is also significantly eliminated. For instance, the impedance matching time may be 5 milliseconds or less.

In an embodiment of the present disclosure, the first power may be applied in a pulsed mode. The duty ratio of the first power may be between about 5% and about 50%, more specifically, between about 10% and about 30%. The pulsing frequency of the first power may be between about 100 Hz and between 3,000 Hz, more specifically, between about 300 Hz and between 1,000 Hz.

Figure 6:
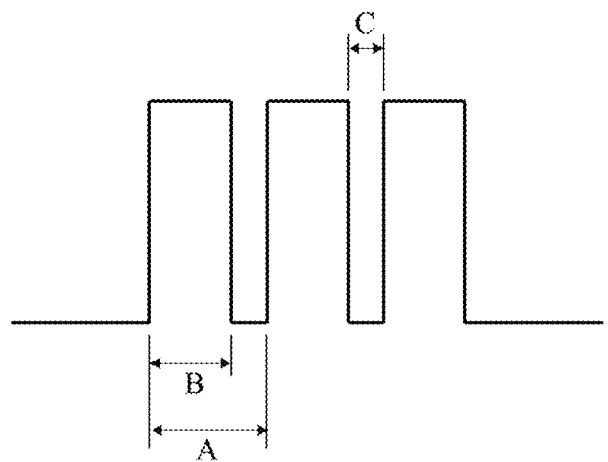
FIG. 6 illustrates a duty ratio and a pulsing frequency in a pulsed mode.

FIG. 6 illustrates a duty ratio and a pulsing frequency in a pulsed mode. In FIG. 6, the duty ratio may be defined as a ratio of B to A (B/A) and the pulsing frequency may be defined as the interval between pulsings as indicated as C.

Applying a power in a pulsed mode may enable radicals to diffuse deeply to the lower portion of the recess. During a power is on and an electric filed is created, active species such as electrons and ions interrupt radicals (e.g. dissociated source molecules and reactant molecules) from diffusing, but during a power is off and an electric field is extinct, active species become neutral. Thus, radicals may diffuse deeply to the lower portion of the recess with less interruption and react chemically with a substrate to form a film. In addition, a damage to the substrate by the ion bombardment may be reduced during a power is off. Therefore, a film conformality may be improved from the upper portion throughout the lower portion of the recess and the damage to the substrate may be reduced.

In step 120 of FIG. 4, the first film may be treated by applying a second power while supplying a reactant and/or an inert gas. The treatment may be carried out to modulate the film properties such as wet etch ratio (WER) and density. For instance, the film formed on the surface of the recess may be densified by the treatment.

In step 120, the second power may be applied in a continuous mode in dual frequencies. But in another embodiment, the second power may be applied in a pulsed mode. The second power may comprise a high frequency power and a low frequency power. The high frequency power may be between about 1,000 W and about 2,000 W and the low frequency power may be between about 100 W and about 800 W. The high frequency may be between about 10 MHz and about 20 MHz and the low frequency may be about 300 KHz and about 500 KHz. The second power may be supplied for 0.2 seconds or less.

Like in the step 110, in step 120, an impedance matching may be carried out by using the EVC matching network during applying the second power. Therefore, the impedance matching time may be reduced significantly and the reflected power may be eliminated significantly, resulting in short process time.

In one embodiment, a purge step may be provided to purge the reaction chamber after forming the first film and before treating the first film (i.e. after the step 110 and before the step 120).

In step 130, whether a target thickness of the first film is achieved or not may be determined. If the target thickness is achieved, then the substrate processing process may end in step 140. Otherwise, the step 110 and the step 120 may be repeated a plurality of times.

Figure 7:
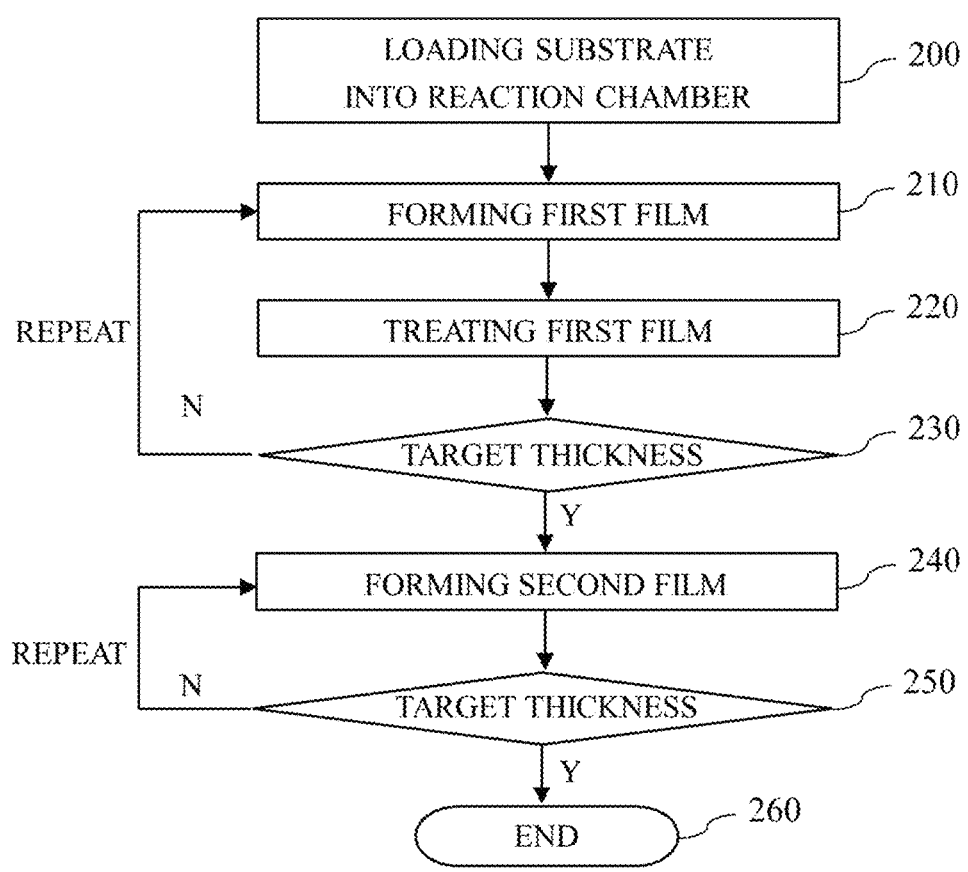
FIG. 7 illustrates a substrate processing method according to the embodiment of the present disclosure.

Optionally, the substrate processing process may further carry out to form a second film on the first film as shown in FIG. 7.

FIG. 7 illustrates a substrate processing method according to the embodiment of the present disclosure. The steps 200 to 230 are the same as the steps 100 to 130 of FIG. 4, thus a repeated description of each step will be provided briefly.

In step 200, a substrate is loaded into a reaction chamber. The substrate may comprise a complex structure, e.g. a recess and 3D gate structure etc.

In step 210, a first film may be formed on the substrate. The first film may be formed by supplying a silicon source from a source vessel and a reactant to the substrate through a gas supply unit while applying a first power from the power supply unit to the reaction chamber. The silicon source and the first power may be supplied simultaneously.

In step 220, the first film may be treated by applying a second power while supplying a reactant and/or an inert gas. The treatment may be carried out to modulate the film properties such as wet etch ratio (WER) and density. For instance, the film formed on the surface of the recess may be densified by the treatment.

In step 220, the second power may be applied in a continuous mode in dual frequencies. But in another embodiment, the second power may be applied in a pulsed mode. The second power may comprise a high frequency power and a low frequency power.

In one embodiment, a purge step may be provided to purge the reaction chamber after forming the first film and before treating the first film (i.e. after the step 210 and before the step 220).

The first film may comprise silicon, carbon, nitrogen, or oxygen. The carbon and the nitrogen may come from a silicon source molecule. Thus, the first film may be at least one of silicon oxide, silicon carbon oxide, silicon nitride, silicon carbon nitride, silicon carbon oxynitride and the combination thereof.

In step 230, whether a target thickness of the first film is achieved or not may be determined. If the target thickness of the first film is not achieved, the step 210 and the step 220 may be repeated a plurality of times.

In step 240, if the target thickness of the first film is achieved, then a second film may be formed on the first film. The second film may be formed by conventional PEALD method in which the silicon source and a third power may be supplied sequentially and intermittently. The reactant may be supplied continuously throughout the cycle.

In step 240, the silicon source may be supplied for 0.1 seconds or less and the power may be applied for 0.2 seconds or less. The third power may be a dual frequency power. For instance, a high frequency power of between about 500 W and about 1,500 W and a low frequency power of between about 500 W and about 1,500 W may be applied in the step 240.

The silicon source may comprise at least one of: TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Mc)_2)_3$; BEMAS, $SiH_2[N(Et)(Mc)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; or a mixture thereof.

The reactant may comprise at least one of $O_2$, $O_3$, $CO_2$, $H_2O$, $NO_2$, $N_2O$, $N_2$, $NH_3$, $NH_4$, $N_2H_2$, $N_2H_4$, radicals thereof; or a mixture thereof.

The second film may comprise silicon, carbon, nitrogen, or oxygen. The carbon and the nitrogen may come from a silicon source molecule. Thus, the first film may be at least one of silicon oxide, silicon carbon oxide, silicon nitride, silicon carbon nitride, silicon carbon oxynitride, or a combination thereof.

In step 250, whether a target thickness of the second film is achieved or not may be determined. If the target thickness is achieved, then the substrate processing process may end in step 260. Otherwise, the step 240 may be repeated a plurality of times.

In steps 210, 220, and 240, an impedance matching between the power supply unit and the reaction chamber may be carried out by the EVC matching network during the power is applied. For instance, the impedance matching time may be 5 milliseconds or less. Therefore, the impedance matching may be carried out fast.

In one embodiment, the first film forming steps 210 to 220 and the second film forming step 240 may form a super cycle and the super cycle may be repeated a plurality of times.

Figure 8:
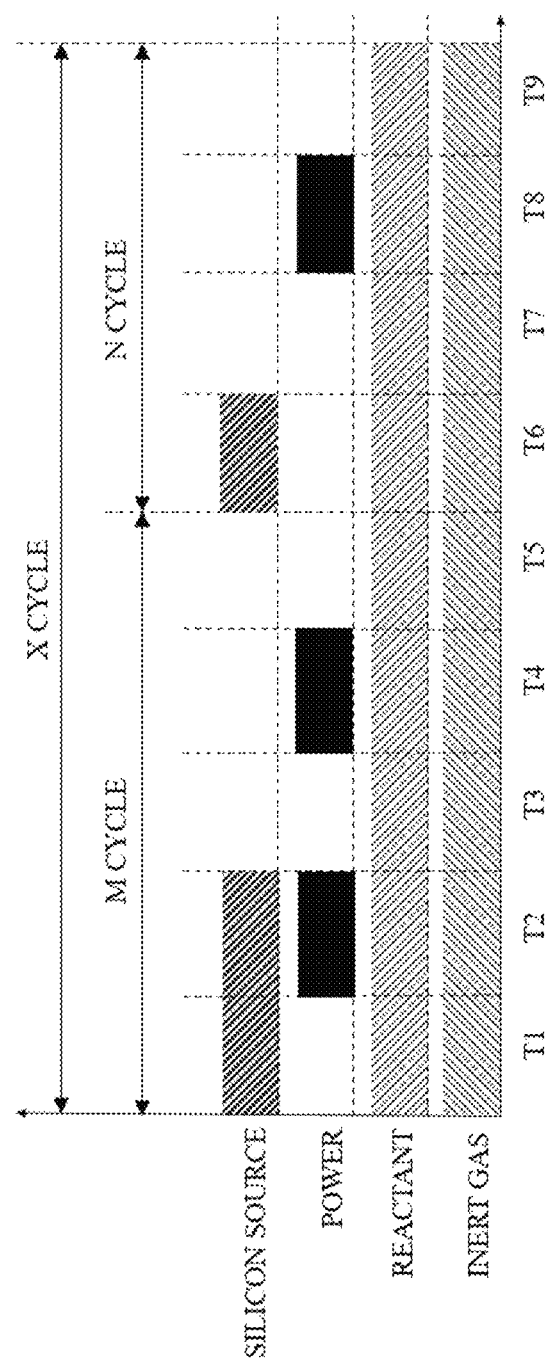
FIG. 8 illustrates a timing graph according to an embodiment of the present disclosure.

FIG. 8 illustrates a timing graph according to an embodiment of the present disclosure.

In FIG. 8, the steps T1 to T5 are steps for forming a first film and correspond to the steps 110 and 120 of FIG. 4 and the steps 210 to 220 of FIG. 7. In step T2, a silicon source and a reactant may be supplied simultaneously while a power (i.e. a first power) is applied. Therefore, a film growth rate may increase and a thick film may be formed.

Optionally, the silicon source may be supplied in step T1 and step T2. By supplying the silicon source to the reaction chamber in step T1 beforehand, the silicon source may be distributed evenly in the reaction chamber and the process may become stable in step T2 in which a film may be formed by chemical reaction between the silicon source and the reactant.

In forming the first film on a recess, forming a conformal film along the surface of the recess is required. Therefore, the intensity of the power (i.e., a first power) may not be high and the silicon source supply time may be short in order to activate the silicon precursor and the reactant less and prevent a thick film from being formed in the upper portion of the recess. For instance, the power in the step T2 may be between about 10 W and about 2,000 W, more specifically, between about 20 W and about 500 W and the silicon source may be supplied for 0.1 seconds or less.

In one embodiment of the present disclosure, the power may be applied in a pulsed mode in the step T2 with a duty ratio of between about 5% and about 50%, more specifically, between about 10% and about 30%.

Besides the low intensity of the power and the short silicon source supply time, a silicon source vapor pressure may be modulated in order to prevent an excessive amount of silicon source from being supplied and a thick film from being formed in the upper portion of the recess. For instance, a temperature of silicon source vessel containing the silicon source may be 50° C. or less.

As aforementioned, the silicon source and the power are supplied for a very short time (i.e. 0.1 seconds or less for the silicon source and the first power and 0.2 seconds or less for the second power). Therefore, a fast gas switching in the reaction chamber is required otherwise a residual gas may cause unwanted film to be formed, resulting in poor film conformality on the recess. To that end, a thickness of the gas supply unit (e.g. a showerhead plate) may be thin for a gas to stay for a short time in the reaction space. For instance, a thickness of the showerhead plate may be 10 mm or less.

In step T4, the first film may be treated by applying a power (i.e. a second power) while supplying a reactant and/or an inert gas. The treatment may be carried out to modulate the film properties such as wet etch ratio (WER) and density. For instance, the film formed on the surface of the recess may be densified by the treatment.

The power in the step T4 may be a dual frequency power comprising a high frequency power and a low frequency power. The second power may be applied for 0.2 seconds or less.

In FIG. 8, the steps T6 to T9 are steps for forming a second film and correspond to the step 240 of FIG. 7. The second film may be formed by conventional PEALD method in which the silicon source and a power (i.e. a third power) may be supplied sequentially and intermittently. The reactant may be supplied continuously throughout the cycle. In step T6, the silicon source may be supplied for 0.1 seconds or less and in step T8, the power may be applied for 0.2 seconds or less.

The first film and the second film may comprise a silicon, carbon, nitrogen and oxygen. The carbon and the nitrogen may come from a silicon source molecule. Thus, the first film and the second film may be at least one of silicon oxide (SiO), silicon carbon oxide (SiCO), silicon nitride (SiN), silicon carbon nitride (SiCN), silicon carbon oxynitride (SiCON), or a combination thereof.

The first film forming phase may be repeated a plurality of times (M cycles) and the second film forming phase may be repeated a plurality of times (N cycles). In addition, the first film forming phase and the second film forming phase may comprise a super cycle and be repeated a plurality of times (X cycles).

In steps T2, T4 and T8, an impedance matching may be carried out by using the EVC matching network during applying the power. Thus, the impedance matching time may be reduced significantly and the reflected power may be eliminated significantly, resulting in short process time.

Figure 9:
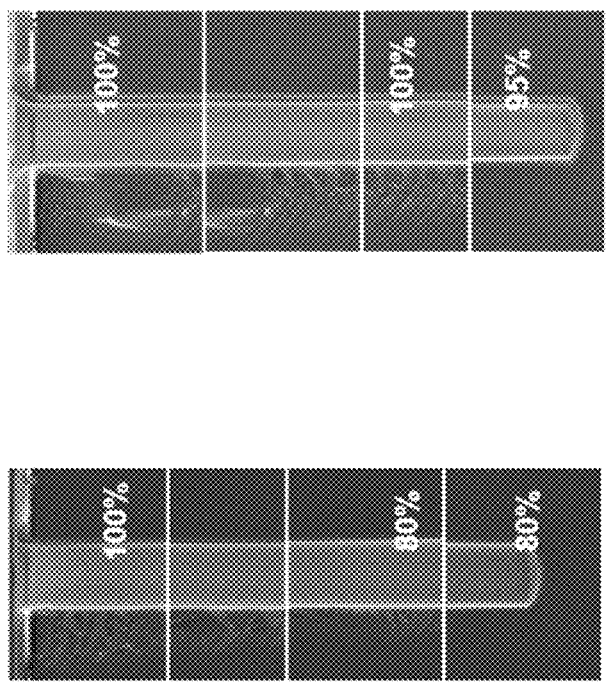
FIG. 9A and FIG. 9B are TEM images showing a film conformality when using a conventional matching network and a thick showerhead plate and using an EVC matching network and a thin showerhead plate in forming a $SiO_2$ film.

FIG. 9A and FIG. 9B are SEM images showing a film conformality when using a conventional matching network and a thick showerhead plate (FIG. 9A) and using an EVC matching network and a thin showerhead plate (FIG. 9B) in forming a SiO$_2$ film (a first film). The SiO$_2$ film is formed by supplying a silicon source and a reactant simultaneously while applying a first power in a pulsed mode, followed by treating the SiO$_2$ film by supplying a second power. Table 1 shows the conformality of SiO$_2$ film formed on the recess as shown in FIG. 9A and FIG. 9B. The aspect ratio of the recess therein may be 1:10 or more.

TABLE 1 a conformality of SiO$_2$ film formed on a recess

|  | FIG. 9A | FIG. 9B |
| --- | --- | --- |
| Type of matching network | Mechanical type | EVC |
| Thickness of showerhead plate | 25 mm | 10 mm |
| Silicon source supply time (sec) | 0.3 | 0.1 |
| First power application time (sec) | 0.2 | 0.05 |
| Second power application time (sec) | 0.2 | 0.05 |
| Sidewall conformality (%) | 80% | 95% |
| Step coverage (%) | 70% | 75% |
| Source consumption (g/wafer) | ~30 g/wafer or more | ~5 g/wafer or less |

As shown in Table 1, in FIG. 9B in which an EVC matching network and a thin showerhead plate are used, a sidewall conformality and a step coverage are better than those in FIG. 9A in which the existing mechanical matching network and thick showerhead are used even though a silicon source supply time and a power application time are shorter in FIG. 9B than those in FIG. 9A. That indicates that an EVC matching and a thin showerhead plate may result in short process time and better process performance by reducing an impedance matching time and improving a gas switching.

Table 1 also shows that in FIG. 9B, a source consumption is less than that in FIG. 9A. Thus, a more efficient substrate processing may be achieved and a CoO (Cost of Ownership) for operating a substrate processing apparatus may be reduced significantly.

Figure 10:
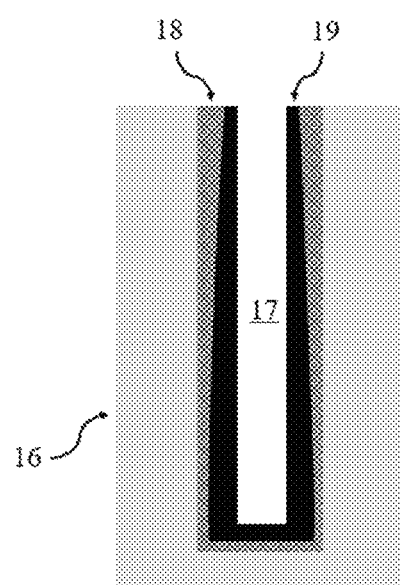
FIG. 10 illustrates the second film is formed on the first film, resulting in better step coverage feature.

FIG. 10 illustrates the second film is formed on the first film, resulting in better step coverage feature.

In FIG. 10, the first film 18 may be formed on the surface of the recess 17 of the substrate 16. The first film 18 may be formed according to the steps 210 to 220 of FIG. 7 (or the steps T1 to T5 of FIG. 8). The film profile of the first film 18 may have a negative slope. After that, the second film 19 may be formed on the first film 18 by PEALD method. The second film may be formed according to the step 240 of FIG. 7 (or the steps T6 to T9 of FIG. 8).

In FIG. 10, the first film 18 may be thicker in an upper portion of the recess 17. In contrast, the second film 19 formed on the first film 18 may be thicker in a lower portion of the recess 17. Thus, the film comprising the first film 18 and the second film 19 may be conformal from the upper portion to the lower portion of the recess, resulting in an improved step coverage on the recess 17.

Figure 11A:
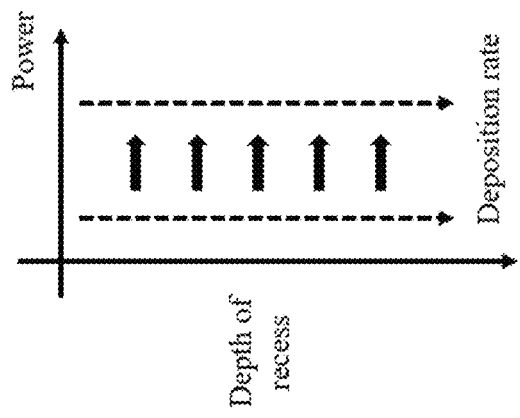
FIG. 11A and FIG. 11B illustrate how a film profile of the second film is non-conformal in which the second film is thicker in an upper portion of the recess.
Figure 11B:
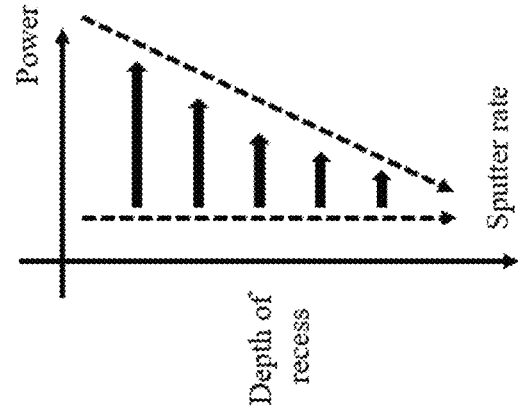

FIG. 11A and FIG. 11B illustrate how a film profile of the second film is non-conformal in which the second film is thicker in an upper portion of the recess.

During applying a power to the deposition process, a deposition by radicals and a sputtering by ions may occur simultaneously. As the power increases, the sputter rate may increase. The sputter rate may be higher in the upper portion than in the lower portion of the recess.

In FIG. 11A, a deposition rate is constant regardless of the depth of the recess even though a power (e.g. RF power) increases. In contrast, in FIG. 11B, a sputter rate increases as a power (e.g. RF power) increases, especially in the upper portion of the recess. Thus, in a certain range of power, a sputter rate may be higher than a deposition rate in the upper portion of the recess, resulting in less thicker film thickness in the upper portion than in the lower portion of the recess in PEALD process.

According to an embodiment of the present disclosure, a high frequency power of between about 50 W and about 2,000 W, more specifically, between about 500 W and about 1,500 W and a low frequency power of between about 50 W and about 2,000 W, more specifically, between about 500 W and about 1,500 W are applied to form the non-conformal second film on the first film by PEALD.

Table 2 shows a film conformality and a step coverage feature of the single film (i.e. the first film) and the dual film (i.e. the first film and the second film formed thereon) according to an embodiment of the present disclosure. In Table 2, the film conformality and the step coverage feature is improved in dual film.

TABLE 2 a film conformality and a step coverage feature

|  | Single film | Dual film |
|---|---|---|
| Conformality | 90% | 95% |
| Step coverage | 85% | 100% |

Table 3 shows test conditions according to an embodiment of the present disclosure.

TABLE 3 a test condition for forming a film

| Items | | | Conditions |
|---|---|---|---|
| gas flow rate (sccm) | | Purge Ar | 100 to 10,000 (Preferably 1,000 to 8,000) |
| | | Source carrier Ar | 100 to 10,000 (Preferably 1,000 to 8,000) |
| | | $O_2$ (reactant) | 100 to 10,000 (Preferably 1,000 to 8,000) |
| Process time (sec) | Deposition step | Source/Reactant/Plasma | 0.01 to 5.0 (Preferably 0.05 to 0.2) |
| | | Purge | 0.01 to 5.0 (Preferably 0.2 to 1.0) |
| | Treatment step | Plasma treatment | 0.05 to 5.0 (Preferably 0.1 to 2.0) |
| | | Purge | 0.01 to 5.0 (Preferably 0.2 to 1.0) |
| | PEALD step | Source supply | 0.01 to 5.0 (Preferably 0.01 to 0.1) |
| | | Purge | 0.01 to 5.0 (Preferably 0.2 to 1.0) |
| | | Plasma-on | 0.01 to 5.0 (Preferably 0.1 to 2.0) |
| | | Purge | 0.01 to 5.0 (Preferably 0.2 to 1.0) |
| Plasma conditions | Deposition step | RF power (W) | 10 to 2,000 (Preferably 20 to 500) |
| | | RF frequency | 10 MHz to 20 MHz (HRF) |
| | | Duty ratio | 5% to 80% (Preferably 10% to 30%) |
| | Plasma treatment step | RF power (W) | 500 to 3,000 (Preferably 1,000 to 2,000) for HRF 50 to 1,000 (Preferably 100 to 800) for LRF |
| | | RF frequency | 10 MHz to 20 MHz for HRF 300 KHz to 500 KHz for LRF |
| | PEALD step | RF power (W) | 50 to 2,000 (Preferably 500 to 1,500) for HRF 50 to 2,000 (Preferably 500 to 1,500) for LRF |
| | | RF frequency | 10 MHz to 20 MHz for HRF 300 KHz to 500 KHz for LRF |
| Process pressure (Torr) | | | 1.5 to 5.0 |
| Process temperature (° C.) | | | 50 to 550 (Preferably 300 to 550) |
| Precursor (Si source) | | | Aminosilane |

Figure 12:
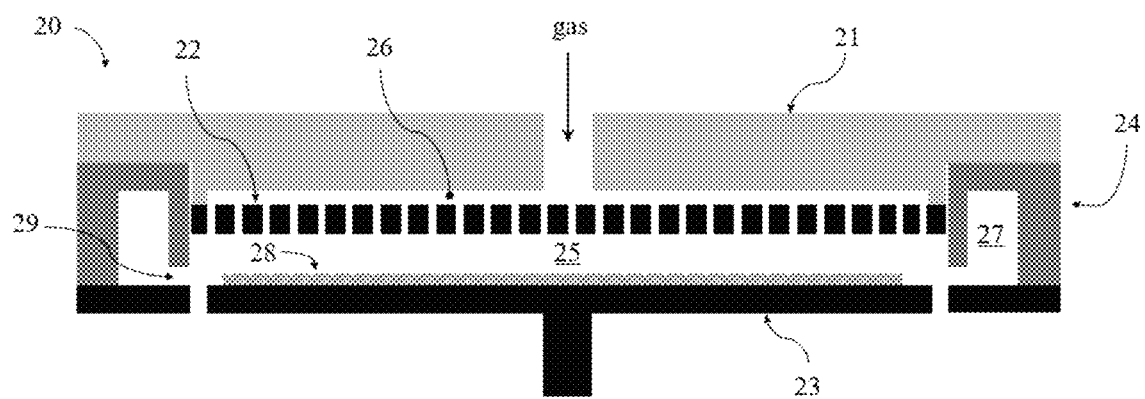
FIG. 12 is a cross-sectional view of the reaction chamber.

FIG. 12 is a cross-sectional view of the reaction chamber. The reaction chamber 20 may correspond to the reaction chamber 2 of FIG. 1.

The reaction chamber 20 may comprise a gas channel 21, a gas supply unit 22, a substrate support unit 23 supporting a substrate 28, and an exhaust duct 24. The gas supply unit 22 may be a showerhead plate made of metal and may be connected to a power supply unit comprising an EVC matching network (not shown). The gas channel 21 and the exhaust duct 24 may be formed of insulating material, thus the gas supply unit 22 may be isolated electrically from the surrounding environment during a power is applied to the gas supply unit 22.

A gas flow channel 26 may be formed between the gas channel 21 and the gas supply unit 22. A reaction space 25 where a chemical reaction between a gas and the substrate 28 may occur may be formed between the gas supply unit 22 and the substrate support unit 23. The exhaust duct 24 may surround the reaction space 25 and a gas in the reaction space 25 may be exhausted to an exhaust path 27 through a gap 29 formed between the exhaust duct 24 and the reaction space 25.

The present disclosure enables a fast gas exchange for short process time. To that end, the gas supply unit 22 may be thin and the volume of the gas flow channel 26 and the reaction space 25 may be small for fast gas switching. For instance, the thickness of the gas supply unit 22 may be 10 mm or less and the distance between the gas channel 21 and the gas supply unit 22 (i.e. the height of the gas flow channel 26) may be 5 mm or less. The distance between the gas supply unit 22 and the substrate support unit 23 (i.e. the height of the reaction space 25) may be 5 mm or less.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

The invention claimed is:

1. A method of forming a film comprising:
   loading a substrate comprising a recess into a reaction chamber, wherein a gas supply unit is connected to the reaction chamber;
   forming a first film on the substrate by supplying a silicon source from a source vessel and a reactant to the substrate simultaneously through the gas supply unit while applying a first power from a power supply unit to the reaction chamber; and
   treating the first film by applying a second power from the power supply unit to the reaction chamber while supplying the reactant;
   wherein forming the first film and treating the first film are repeated a plurality of times;
   wherein the power supply unit comprises a matching network comprising a plurality of electronically variable discrete capacitors to match an impedance between the power supply unit and the reaction chamber; and
   wherein the second power is greater than the first power.

2. The method of claim 1, wherein the silicon source is supplied for 0.1 seconds or less.

3. The method of claim 1, wherein a matching time between the power supply unit and the reaction chamber is 5 milliseconds or less, while supplying the first power and supplying the second power.

4. The method of claim 1, further comprising purging the reaction chamber after forming the first film and before treating the first film.

5. The method of claim 4, wherein the reaction chamber is purged for 0.2 seconds or less.

6. The method of claim 1, wherein the first power is a high frequency power of between about 20 W and about 500 W.

7. The method of claim 1, wherein the first power is applied in a pulsed mode.

8. The method of claim 7, wherein a duty ratio of the first power is between about 5% and about 50%.

9. The method of claim 8, wherein a duty ratio of the first power is between about 10% and about 30%.

10. The method of claim 7, wherein a pulsing frequency of the first power is between about 100 Hz and about 3,000 Hz.

11. The method of claim 10, wherein a pulsing frequency of the first power is between about 300 Hz and about 1,000 Hz.

12. The method of claim 1, wherein the first power is applied for 0.1 seconds or less.

13. The method of claim 1, wherein the second power is applied in a continuous mode in dual frequencies.

14. The method of claim 13, wherein the second power comprises a high frequency power and a low frequency power.

15. The method of claim 14, wherein the high frequency power is between about 1,000 W and about 2,000 W.

16. The method of claim 14, wherein the low frequency power is between about 100 W and about 800 W.

17. The method of claim 1, wherein the second power is applied for 0.2 seconds or less.

18. The method of claim 1, wherein the source vessel is maintained at 50° C. or less.

19. The method of claim 1, wherein a thickness of the gas supply unit is 10 mm or less.

20. The method of claim 1, further comprising forming a second film on the first film by repeating a cycle comprising: supplying the silicon source to the reaction chamber; and applying a third power to the reaction chamber to form the second film, wherein the reactant is supplied throughout the cycle.

21. The method of claim 20, wherein forming the first film and forming the second film comprise a super cycle, wherein the super cycle is repeated a plurality of times.

22. The method of claim 20, wherein the first film is thicker in an upper portion of the recess and the second film formed on the first film is thicker in a lower portion of the recess, wherein the film comprising the first film and the second film is conformal from the upper portion to the lower portion of the recess.

23. The method of claim 20, wherein the third power comprises a high frequency power and a low frequency power.

24. The method of claim 23, wherein the high frequency power is between about 500 W and about 1,500 W.

25. The method of claim 23, wherein the low frequency power is between about 500 W and about 1,500 W.

26. The method of claim 20, wherein the first film and the second film comprise at least one of silicon oxide, silicon carbon oxide, silicon nitride, silicon carbon nitride, silicon carbon oxynitride, or a combination thereof.

27. The method of claim 20, wherein the silicon source comprises at least one of: TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; or a mixture thereof.

28. The method of claim 20, wherein the reactant comprises at least one of $O_2$, $O_3$, $CO_2$, $H_2O$, $NO_2$, $N_2O$, $N_2$, $NH_3$, $NH_4$, $N_2H_2$, $N_2H_4$, radicals thereof; or a mixture thereof.

* * * * *